US006795789B2

(12) United States Patent
Vandiver

(10) Patent No.: US 6,795,789 B2
(45) Date of Patent: Sep. 21, 2004

(54) SYSTEM FOR TESTING OF INTELLIGENT ELECTRONIC DEVICES WITH DIGITAL COMMUNICATIONS

(75) Inventor: Benton Vandiver, Houston, TX (US)

(73) Assignee: Omnicron Electronics Corp. USA, Houston, TX (US)

(*) Notice: Subject to any disclaimer, the term of this patent is extended or adjusted under 35 U.S.C. 154(b) by 128 days.

(21) Appl. No.: 09/862,015

(22) Filed: May 21, 2001

(65) Prior Publication Data

US 2002/0173927 A1 Nov. 21, 2002

(51) Int. Cl.[7] .......................... G01M 19/00; G06F 19/00
(52) U.S. Cl. .......................... 702/122; 702/57; 702/120
(58) Field of Search ............................. 702/57–62, 108, 702/117–122, 124, 182–185, 188; 324/74, 424; 703/18

(56) References Cited

U.S. PATENT DOCUMENTS

| | | | | |
|---|---|---|---|---|
| 4,517,511 A | * | 5/1985 | Suto | 324/529 |
| 4,814,712 A | * | 3/1989 | Burton et al. | 324/424 |
| 5,057,771 A | * | 10/1991 | Pepper | 324/753 |
| 5,650,936 A | * | 7/1997 | Loucks et al. | 702/62 |
| 5,736,847 A | * | 4/1998 | Van Doorn et al. | 324/142 |
| 5,963,734 A | | 10/1999 | Ackerman et al. | |
| 6,005,759 A | * | 12/1999 | Hart et al. | 361/66 |
| 6,065,042 A | | 5/2000 | Reimer et al. | |
| 6,121,886 A | | 9/2000 | Anderson | |
| 6,133,720 A | * | 10/2000 | Elmore | 324/74 |
| 6,259,972 B1 | * | 7/2001 | Sumic et al. | 700/286 |
| 6,426,632 B1 | * | 7/2002 | Clunn | 324/509 |
| 2002/0038981 A1 | * | 4/2002 | Brown et al. | 307/125 |
| 2002/0046246 A1 | * | 4/2002 | Wright et al. | 709/206 |
| 2002/0095097 A1 | * | 7/2002 | Drongelen | 600/544 |

* cited by examiner

Primary Examiner—Marc S. Hoff
Assistant Examiner—Manuel L Barbee
(74) Attorney, Agent, or Firm—Akin Gump Strauss Hauer & Feld LLP

(57) ABSTRACT

The test system provides conventional analog outputs that allowing application of power system conditions simulation to a device under test. The test device has a communication interface which sends and receives digital communication to and from protection relays, control devices, and meters, known as intelligent electronic devices (IEDs). The test device interacts with the devices under test over a direct communication link or a substation local area network. The communication protocol includes digital communication to send and receive messages which simulate virtual switching and control equipment status and other intelligent electronic device (IED) data and status. The test system monitors the operation of the IED device under test based on the IED digital communication data received and the contained control signal status utilizing the digital communication interface as a substitute for the conventional hard-wiring of IED binary inputs and outputs.

15 Claims, 8 Drawing Sheets

| | |
|---|---|
| G.O.O.S.E. Message | Generic Object Oriented Substation Event, reports in real-time, the state changes of IED Inputs and Outputs. |
| HoldTim | Hold time, the time that a particular message (status) is held before it is canceled. Cancellation, depending on the status reported, may result in an automatic reset of the conditions (e.g., a BFI timer is canceled or the removal of a "block" condition). In order for the status conditions within the message to remain valid, a repeat of the message must be received before the hold time expires. The hold time is incremented each time the message is sent and may follow geometric progression e.g., 10, 20, 30, 40, 50 ....... up to a maximum of one minute. (The timers and progressions are parameterized.) The progression timers reset when a new GOOSE is created. |
| Back Time: | The time since the last status change. The receiving IED can use Back Time to set appropriate local times associated with the original state even if intervening messages were lost. |
| Refresh Interval | The time between repeat GOOSE messages. The interval shall be less than 1/3 of the HoldTim. The refresh time is parameterized and shall be randomized to minimize collisions. |
| PreDNA | Preset DNA output values if enabled. Pre Set Values are values used to force the value of a DNA bit pair to a preset value when the SelInDNA for the bit pair is set to Preset. |
| Pass Through | When the SelInDNA is set to Pass Through, the GOOSE DNA value is used. When the validity time for the DNA has expired, the last GOOSE DNA value for the bit pair is used rather than the default value. |
| SendIED: | The Sending IED IDENT uniquely names the device reporting the GOOSE. Therefore, a given reporting IED may handle several "devices."Relay Settings |
| StNum | State Number is incremented by one each time an IED sends information that is "new" or "changed." Thus, this number uniquely tags the GOOSE event. It rolls over after the max count is reached. |
| t | Timestamp, an optional component used to indicate the last time the object was updated. A default of zero indicates that no time stamp is available. In the case of a GOOSE message, timestamp refers to the time the message was sent. |
| UserSt | User defined status (in bit pairs) included in GOOSE message |
| DNA | Protection DNA (see Fig. 4) |

FIG. 3

DNA MESSAGES

| Bit # | Bit Pair | Bit Order / Value / Definition | 00 / 0 / State | 01 / 1 / State | 10 / 2 / State | 11 / 3 / State |
|---|---|---|---|---|---|---|
| 0, 1 | 1 | OperDev | Normal | Trip | Close | Invalid |
| 2, 3 | 2 | Lock Out | Invalid | Normal | LO | Invalid |
| 4, 5 | 3 | Initiate Reclosing | Normal | Cancel | Auto Reclosing | Invalid |
| 6, 7 | 4 | Block Reclosing | Normal | Cancel | Block | Invalid |
| 8, 9 | 5 | Breaker Failure Initiate | Normal | Cancel | Initiate | Invalid |
| 10, 11 | 6 | Send Transfer Trip | Normal | Cancel | Set | Invalid |
| 12, 13 | 7 | Receive Transfer Trip | Normal | Cancel | Set | Invalid |
| 14, 15 | 8 | Send Perm | Normal | Cancel | Send Perm | Invalid |
| 16, 17 | 9 | Receive Perm | Normal | Cancel | Receive Perm | Invalid |
| 18, 19 | 10 | Stop Perm | Normal | Cancel | Stop Perm | Invalid |
| 20, 21 | 11 | Send Block | Normal | Cancel | Send Block | Invalid |
| 22, 23 | 12 | Receive Block | Normal | Cancel | Receive Block | Invalid |
| 24, 25 | 13 | Stop Block | Normal | Cancel | Stop Block | Invalid |
| 26, 27 | 14 | BkrDS | Between | Open | Closed | Invalid |
| 28, 29 | 15 | BkrPhsADS | Between | Open | Closed | Invalid |
| 30, 31 | 16 | BkrPhsBDS | Between | Open | Closed | Invalid |
| 32, 33 | 17 | BkrPhsCDS | Between | Open | Closed | Invalid |
| 34, 35 | 18 | DiscSwDS | Between | Open | Closed | Invalid |
| 36, 37 | 19 | Interlock DS | Invalid | Non Interlock | Interlock | Invalid |
| 38, 39 | 20 | LineEndOpen | Between | Open | Closed | Invalid |
| 40, 41 | 21 | Mode | Test | Offline | Available | Unhealthy |
| 42, 43 | 22 | Event | Invalid | Normal | Event | Invalid |
| 44, 45 | 23 | Fault Present | Invalid | Clear | Present | Invalid |
| 46, 47 | 24 | Sustained Arc | Invalid | Normal | Present | Invalid |
| 48, 49 | 25 | Downed Conductor | Invalid | Normal | Downed | Invalid |
| 50, 51 | 26 | Sync Closing | Normal | Cancel | Initiate | Invalid |
| 52, 53 | 27 | Reserved | | | | |
| 54, 55 | 28 | Reserved | | | | |
| 56, 57 | 29 | Reserved | | | | |
| 58, 59 | 30 | Reserved | | | | |
| 60, 61 | 31 | Reserved | | | | |
| 62, 63 | 32 | Reserved | | | | |

FIG. 4

SYSTEM FOR TESTING OF INTELLIGENT ELECTRONIC DEVICES WITH DIGITAL COMMUNICATIONS

CROSS-REFERENCE TO RELATED APPLICATIONS

Not applicable.

STATEMENTS REGARDING FEDERALLY SPONSORED RESEARCH OR DEVELOPMENT

Not applicable.

REFERENCE TO A MICROFICHE APPENDIX

Not applicable.

BACKGROUND OF THE INVENTION

1. Field of the Invention

This invention relates generally to testing of protection systems for electric power lines, transformers, generators, and substation apparatus and more particularly concerns testing of protection and control intelligent electronic devices (IEDs) based on a data exchange using digital communication between the test system and the intelligent electronic devices (IEDs) being tested which eliminates the need for individual point-to-point wiring of the binary input and output status between the IEDs and test system.

2. Description of the Related Art

Electric power systems generally include a generating source, high-voltage transmission lines and a lower voltage distribution network for delivery of electric power to customers. The apparatus and components of the electric power system are typically monitored with a number of protection relays, protection devices, and meters that determine, among other tasks, where and when a fault occurs in the power system. These protective relays and devices isolate the fault and maintain power system integrity by controlling the power system apparatus, typically circuit breakers and switches with open (trip) or close command signals.

Protective relays historically are mechanical, electromechanical, or solid-state in design, being single-function protective devices, and provide no data communication capabilities. Each single-function protective device is used to detect a specific power system problem by typically monitoring a combination of voltage/current waveforms and/or the power system apparatus status and based on a threshold setting toggle a relay contact close/open (1 or 0 respectively) indicating that logical threshold detection. By grouping multiple single-function protection devices, more complex protection logic can be provided to precisely control the apparatus of the electric power system.

Using prior art, testing these single-function protection devices required a test system for generation of analog outputs that typically included voltage and current waveforms which simulated the electric power system condition that the protection device was designed to detect. Simultaneously, the protection device was monitored via an output contact (as an input to the test system) to determine the proper detection of the simulated condition. Additionally, the test system provided a contact output to simulate the power system apparatus status which was synchronized to the simulation as an input to the protection device if required for its detection logic.

More recently, protective relay designs have been microprocessor based and provide multi-functional protection, monitoring, and control capabilities with multiple data communication ports; such relay designs are commonly referred to as a digital relay, a computer relay, or an intelligent electronic device (IED). Using existing techniques, testing each protection function of such IEDs presents a complicated task. Multiple simulations of normal, faulted, or abnormal power system conditions are required for the IED to uniquely respond with each individual protection function. For each response, an individual output contact must be dedicated for that function. To ensure that the IED responds with the proper logic of various protection functions, each function needs to be monitored individually and simultaneously by the test system. This generally requires a large number of available output contacts on the IED and a corresponding number of input monitoring points on the test system. Since this is neither economical nor practical, testing is relegated to a limited number of outputs and inputs for both IED and test system. In order to test all IED protective functions, a procedure of individually enabling a protective function and testing or rewiring of some output/input connections of the test system is needed. This procedure is both time-consuming and prone to error depending on familiarity with the IED and test system and the complication of the simulation required.

A new generation of microprocessor based intelligent electronic devices (IED) with high-speed peer-to-peer communications for protection and control is now becoming the standard in the electric power industry. Industry standard development projects through IEEE and IEC have developed and are nearing adoption of the UCA 2.0 and IEC 61850 communication standards. Both are in draft form but are considered to have been informally adopted by the industry as standards defining the communication protocol among IEDs. These IED devices incorporate the protocol set forth in the standards. Ultimately, the IEDs are designed to replace the exchange of status and control signals between them-previously based on individually wired binary outputs and inputs-with the exchange of data packets containing the status and control signals over a communication link, such as, for example, a direct serial link or over a local area network (LAN), or any other communication means available. Such IED devices cannot be tested with the existing state-of-the-art test systems. These devices require the development of new test solutions to determine functional performance.

Following existing techniques, the test system simulated different power system conditions using analog outputs to generate current and voltage waveforms, and individual relay outputs to simulate the status of power system apparatus like circuit breakers, and other logic and control signals to the IED under test. This required the individual wiring of the test system's contact outputs to the monitored binary inputs of the IED under test. Conversely, to evaluate the performance of the IED under test, existing equipment and techniques require individually wiring each IED functional output to a monitored input of the test system. (FIG. 1)

Existing test systems are designed only to monitor the physical relay outputs of the IED under test and only to simulate power system apparatus status and control signals through their relay outputs, based on individual direct wiring between the IED under test and the test system. Therefore, prior art test systems simply cannot be used for the testing of communications-based IEDs.

SUMMARY OF THE INVENTION

Briefly, according to the present invention, a test device provides testing for testing power system protection, control, and monitoring, communication-based IEDs. Simulated power system conditions are applied to a device under test which in turn transmits status information back to the test device. Communications between the test device and the device or devices under test is had over a digital communications link such as a local area network. Individual point-to-point or hardwired connections are avoided through the use of the network link among the test device and the device(s) under test. The test device formats an output status to be transmitted into a data packet to the device under test, such that the test device simulates power system status of other virtual IEDs. The test device receives status information from the device(s) under test in response to both an applied analog voltage and current waveform and output status digital signals transmitted over the network links. The test device further performs automated test sequences based on the response of the device under test to the simulated power system conditions. Response to the test sequence is then compiled and utilized within the test device to perform power system simulation or IED performance evaluation.

BRIEF DESCRIPTION OF THE SEVERAL VIEWS OF THE DRAWINGS

A better understanding of the present invention can be obtained when the following detailed description of the preferred embodiment is considered in conjunction with the following drawings, in which:

FIG. 3 defines an exemplary data structure communication protocol according to an embodiment of the present invention.

FIG. 4 is a chart listing exemplary status messages according to the data structure of FIG. 3.

DETAILED DESCRIPTION OF THE INVENTION

The illustrative system described in this patent application provides a technique for testing, through simulated power system conditions, of intelligent electronic control and protection devices through data exchange over a digital communication network. For purposes of explanation, specific embodiments are set forth to provide an understanding of the illustrative system. However, it will be understood by one skilled in the art, from reading the disclosure, that the technique may be practiced without these details or through alternative embodiments. Further, although the embodiments are described in terms of a microcontroller architecture, it should be understood that this embodiment is illustrative and is not meant in any way to limit the practice of the disclosed system to a microcontroller system. Also, the use of the terms local area network and wide area network to illustrate how the system communicates is not intended to imply that the illustrative system requires any specific type of communications network. Rather any of a variety of networks may be employed in practicing the technique described herein. Moreover, well known elements, devices, process steps, and the like are not set forth in detail in order to avoid obscuring the disclosed system.

Figure 1:
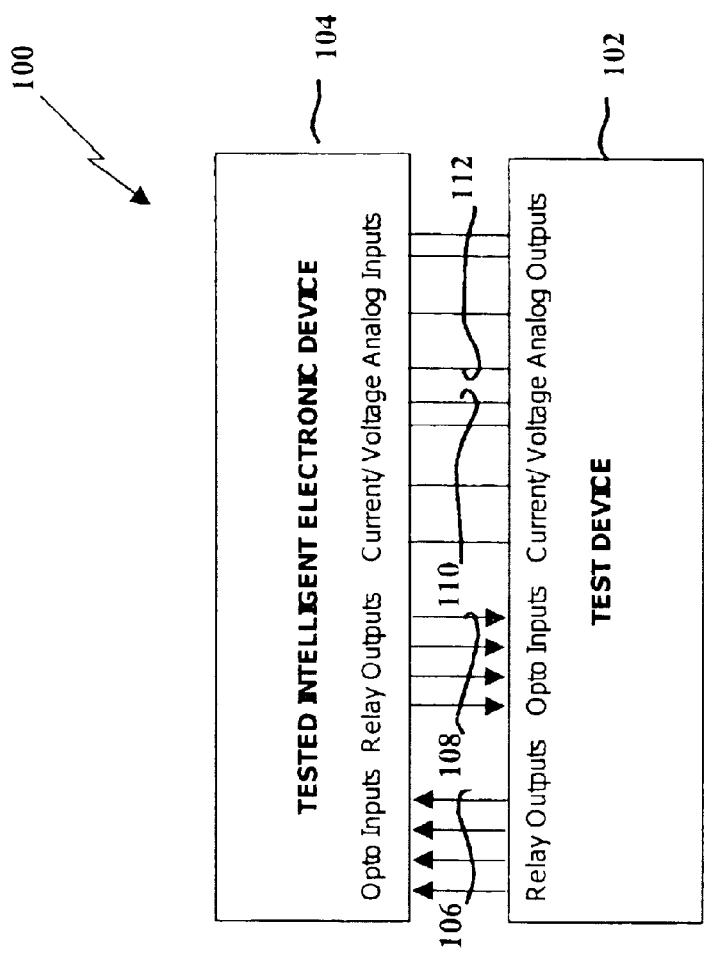
FIG. 1 is a block diagram of a prior art arrangement for testing of protection and control devices.

FIG. 1 shows a typical prior art system 100 for testing of protection and control intelligent electronic devices. The system includes a test device 102 and a test object (the intelligent electronic device) 104. The test device 102 is designed to simulate different power system conditions. Analog outputs of the test device 102 can be configured to provide voltages 112 and currents 110, to simulate the secondary voltages and currents seen by the IED under the simulated power system conditions. Binary outputs 106 of the test device 102 are used to simulate the status of primary or secondary substation equipment during the simulated power system fault or other conditions. Due to existing equipment operational limitations and design, the binary outputs 106 employ direct point-to-point hard wiring. Each connection required a dedicated output contact on the device under test 104, which was also device specific depending on the function or output to be tested. Opto inputs 108 are used to monitor the operation of the device under test 104 in order to change states of the simulation as a function of the device operation. The opto inputs 108 are also used to evaluate the performance of the device under test 104 for the simulated power system conditions.

Such a system 100 meets all requirements for steady state or dynamic testing of conventional intelligent electronic devices, equipped with opto inputs and relay outputs, hardwired to the test device during the testing process. However, the system 100 cannot be used for the testing of communications based intelligent electronic devices, where the hardwired interface is replaced by digital communications.

Figure 2:
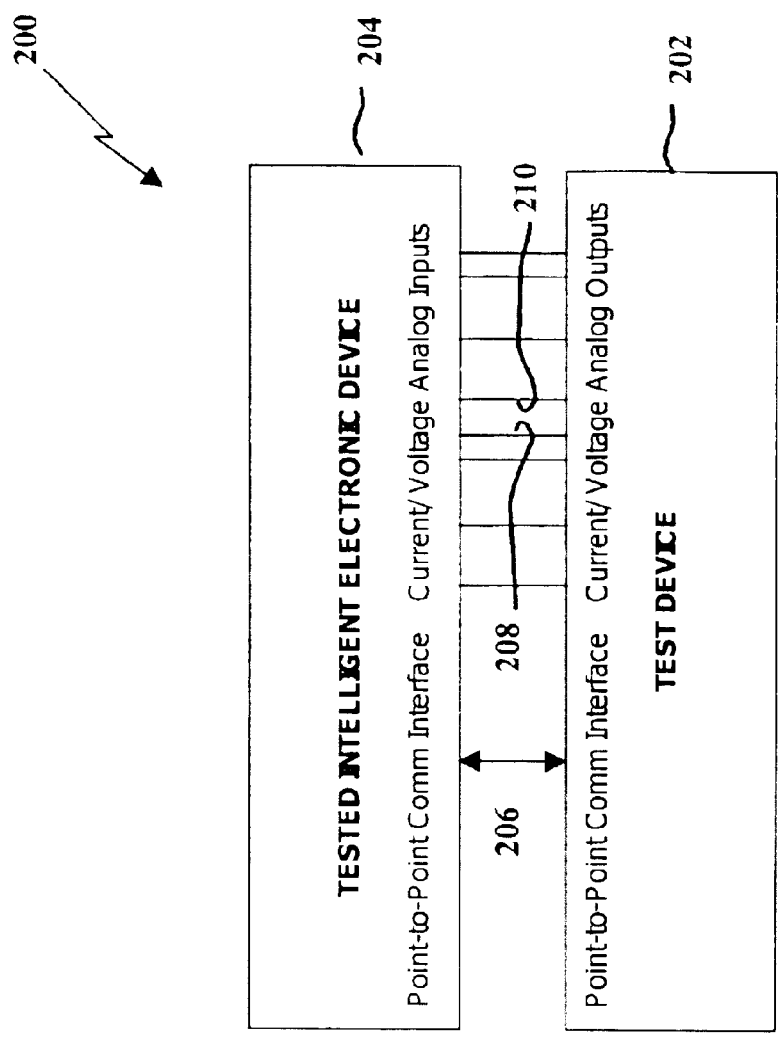
FIG. 2 is a diagram of the data communications based test system of one embodiment of the present invention for testing of a single intelligent electronic device over a communication link.

FIG. 2 shows a simplified diagram of an embodiment of the present invention employing communications based testing of a single intelligent electronic device. As in system 100 from FIG. 1, analog outputs can be configured to provide currents 208 and voltages 210, to simulate the secondary currents and voltages seen by the IED under the simulated power system conditions. However, instead of relay outputs being used to simulate the status of primary or secondary substation equipment during the simulated power system fault or other conditions, data packets containing status information are constructed by the test device 202 and sent to the tested device 204 over a communications link 206.

Data packets received from the device under test 204 over the communication link 206 are used to monitor the operation of the device under test 204 in order to change states of the simulation as a function of the device operation. Various simulation states include specific voltage and current waveforms applied to the device under test 204 over the analog signal lines. Likewise, a simulation state include simulation of a virtual IED through control and status messages transmitted to the device under test 204 from the test device 202. A change to the simulation state includes application of a multiple step test sequence, where a subsequent step is dependent upon the device under test 204 response to a previously applied test stimulus. A device under test 204 response is also used to evaluate the performance of the device under test for the simulated power system conditions.

Such a system meets all requirements for steady state or dynamic testing of intelligent electronic devices with digital communications capabilities, connected to the test device over a digital communication link during the testing process. This allows the testing process without the need for hard-wiring between the test device and test object.

Turning to FIG. 3, shown is an exemplary communication data structure for communications among IEDs and the test device 202. According to the UCA 2.0 and IEC 61850 draft communication standards, a peer-to-peer communication report structure utilized by protection IEDs is defined representing a collection of parameters that define the digital input and digital output status of the transmitting IED. For example, transmission data packets include an identification value of the transmitting IED, SendID shown in row 6 of FIG. 3, which allows the test device 204 or any IED on the network (FIG. 7) to determine the transmitting IED. Other data included in an exemplary data packet include a test sequence count identifier, StNum shown in row 7 of FIG. 3, which is applicable in test operations which include a pre-defined test sequence including multiple test operation. Further, an exemplary data packet includes a DNA message, DNA shown in row 10 of FIG. 3, which reports the status of the transmitting device. DNA messages are discussed in more detail below with reference to FIG. 4. Other common messages also forming part of a data packet are not further discussed as are well known in the art. Typically, although not necessary, the set of available messages are developed based on the environment under test. For example, Generic Object Oriented Substation Event (GOOSE) and Generic Object Models for Substation and Feeder Equipment (GOMSFE) contain predefined messages that describe power substation status. Although the data structure set forth in the UCA 2.0 and the IEC 61850 are discussed for illustrative purposes, any communication protocol may be utilized without departing from the present invention. Further, the present invention is not limited to data packet transmission, but instead is suitable for other communication types as is well known in the art, including, for example, data message streaming.

Turning to FIG. 4, shown are exemplary control and status messages communicated between the device under test 204 and the test device 202. As defined in the UCA 2.0 and the IEC 61850 draft communication standards, a common communication protocol has been established such that a single message conveys all required protection scheme information regarding the transmitting IED. The messages uniquely report the status of the IED to the test device 202 and other IEDs which are part of the network, discussed in more detail with reference to FIG. 7. Each DNA message is broken into bit pairs coding for four states per message type. The DNA message type is determined based on the location of the message within the available 64 bit DNA message. For example, values in bits [49:48] report the occurrence of a downed conductor. The downed conductor message utilizes two of the four available states, normal and downed. A '00' and '11' in bits [49:48] are not used and do not convey status information. Each IED in a network and the test device receives status information such as the DNA messages from the transmitting IED or test device. Further, because the test device 202 is fully compatible with the communication protocol, it may operate as a virtual IED, providing virtual outputs to the device under test 204, as if the device under test 204 were receiving the status information from an actual IED.

Utilization by the test device 204 of the data structure of FIG. 3 and FIG. 4 provides a communication protocol whereby all status information is transmitted to any IED in a network under test over digital network communication lines. Traditional hard-wiring of test device input/output lines with the input/output contacts of a device under test is eliminated. Furthermore, the test device 204 may be easily linked to multiple IED through a network connection, discussed in more detail below with reference to FIG. 7. This eliminates the need to rewire the test device 204 to each device to be tested. Although the specific communication protocol defined by the UCA 2.0 and the IEC 61850 is discussed for exemplary purposes, it will be understood to one skilled in the art that other data structures and communication protocol, such as a proprietary developed protocol, may be utilized without departing from the disclosed invention.

Figure 5:
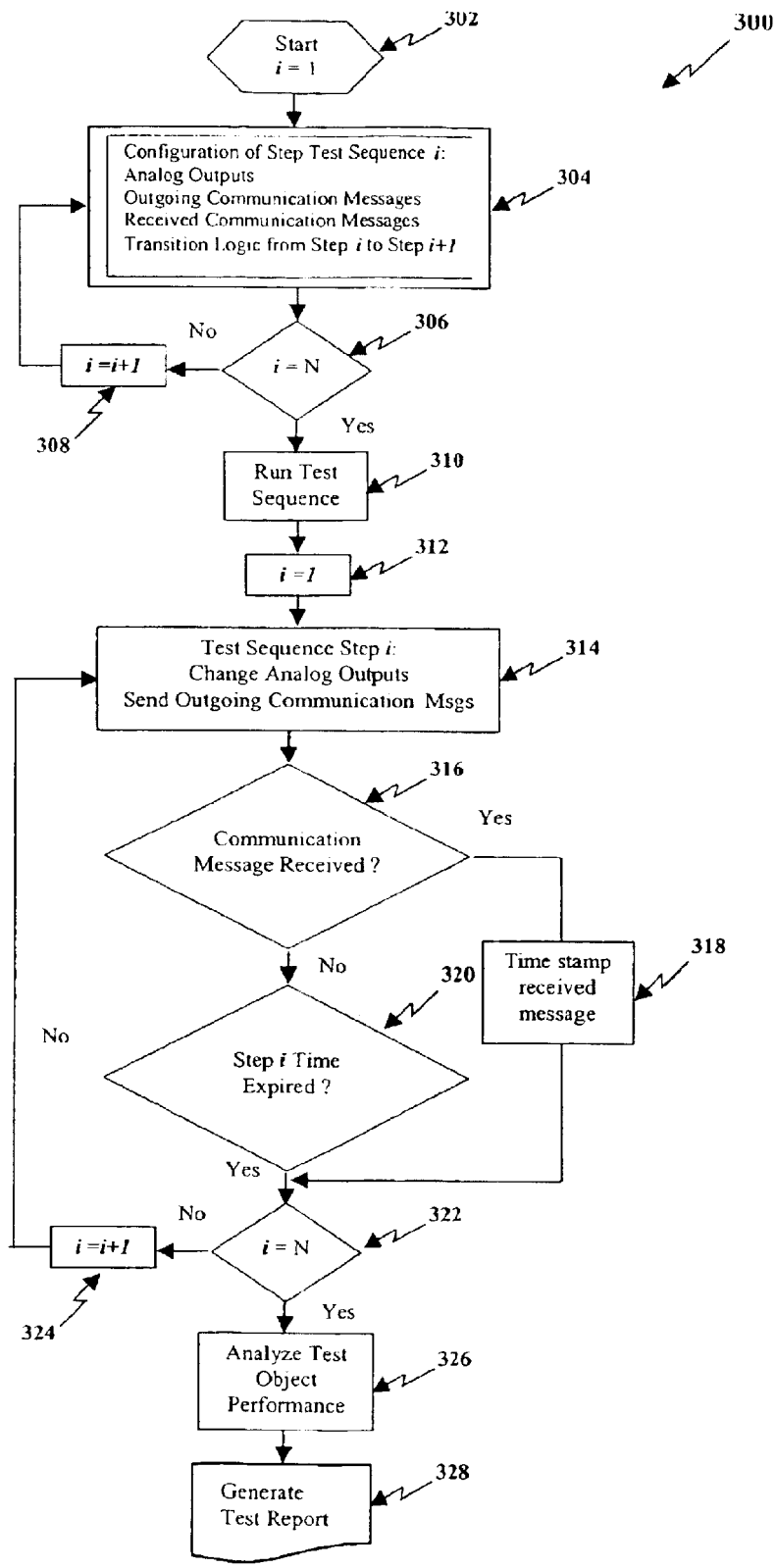
FIG. 5 is a flow chart of an exemplary communications based test process according to an embodiment of the present invention.

FIG. 5 shows an exemplary flow diagram describing the process of that embodiment of the digital communication test sequence. Beginning at step 302, the test sequence is initialized. Configuration of the beginning test step occurs at step 304. Specifically, in this embodiment configuration entails identification of analog outputs to be applied to the device under test and processing of both outgoing and received communication messages from the prior test sequence. Control proceeds to step 306 where the test sequence will continue if the correct test sequence starting point is selected. For example, the starting point for any given test sequence may be predefined by a user identified in step 306 as numeral N. Alternatively, a predetermined step sequence may be defined automatically by the test device software based on current or prior test system conditions. If the test sequence step that is selected is not the desired starting point control loops backs to step 304 through an increment process at step 308. Loop continues until at step 306 the appropriate test sequence step is selected. In such case, control proceeds to step 310 where the test sequence is run.

Initialization of the test sequence occurs at step 312 and then begins at step 314 where the appropriate analog outputs associated with the particular test sequence step are applied to a device under test. Also, the test device 202 transmits outgoing communication messages, such as those described above with reference to FIG. 3 and FIG. 4, over the digital communication link in the form of digital data packets. In step 316 the test device 202 waits until a communication message is received from the device under test 204. If a communication message is received over the digital communication link, the test device 202 time stamps the received message at step 318. Otherwise, the test device 202 waits until expiration of a predetermined time period at step 320 before proceeding to step 322 where an inquiry is made whether the entire test sequence has been run. If additional steps remain within a particular test sequence, the step count is incremented at step 324 and control returns to step 314 where the next step in the test sequence is performed. If the test sequence has been completed at step 322, control proceeds to step 326 where the data is compiled and analyzed to evaluate the performance of the device under test based on the simulated power system conditions generated during the test sequence. Optionally, at step 328, an embodiment of the present invention contemplates formal test report generation to an operator or user. It will be understood to one skilled in the art that other test processes, including pre-programmed test sequences and various timing configurations, may be employed without departing from the spirit of the invention.

Figure 6:
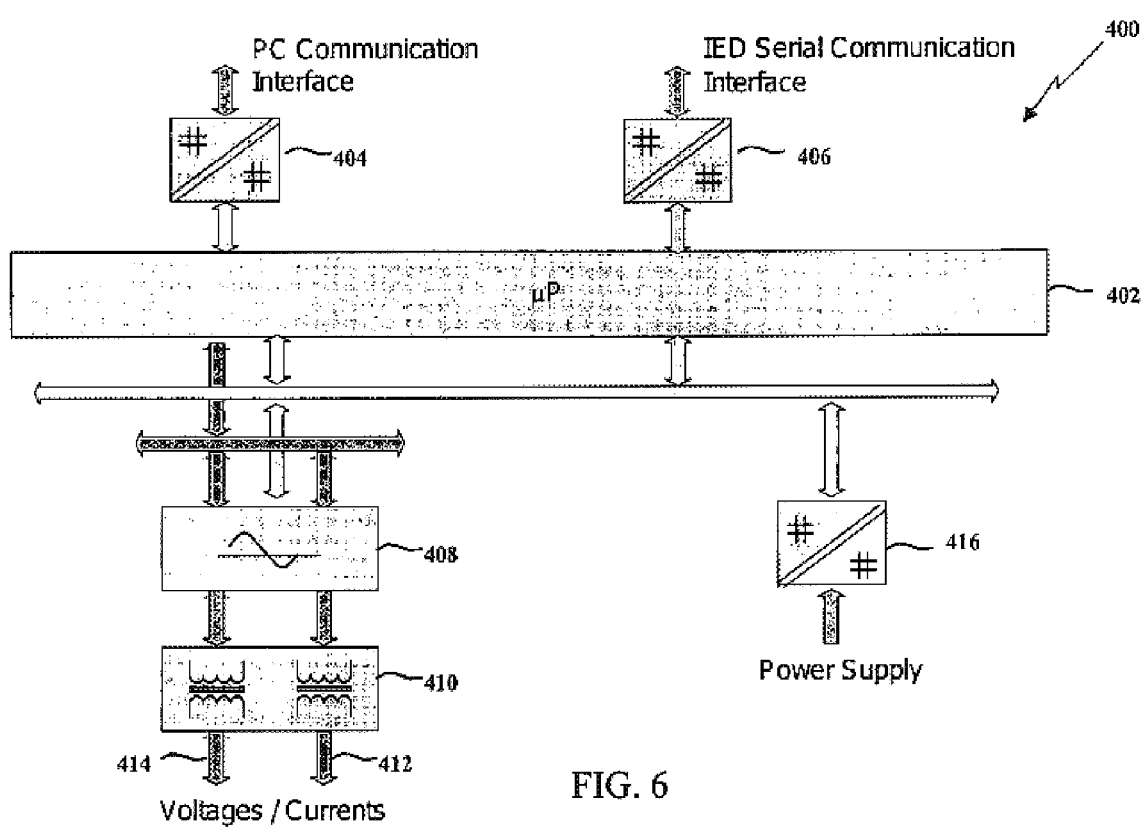
FIG. 6 is a simplified block diagram of a hardware configuration for the test system in FIG. 2.

Turning to FIG. 6, shown is a simplified block diagram of exemplary hardware configuration 400 for the test system of FIG. 2. Specifically, a power supply 416 provides appropriate power levels to the components and devices of system 400. The processor 402 controls the interaction among each of the devices of the system. According to one embodiment, the internal processor 402 to the test device 202 provides a user interface through PC communication interface 404. For example, a user may interact with the test device through an external PC such as a notebook computer. According to another embodiment, the test device 202 may provide a user interface through a built-in monitor or a simplified internal display. Other embodiments for user or other non-user controlled interaction can be employed without departing from the spirit of the invention. Further, the processor may be employed as any number of different configurations without departing from the disclosed invention, such as a micro-controller, a digital signal processor or other circuitry with special or general purpose controller functions.

The processor 402 also directs the digital communications between the device under test 204 through the serial communication interface 406. The processor 402 further receives status information over the serial communication interface 406, which represents the response of a device under test to an applied test stimulus. Exemplary test stimulus includes current and voltage waveforms applied over analog signal lines to represent virtual power system occurrences, such as a voltage spike caused by a lightning strike. In one embodiment, the analog current and voltage waveforms are generated by an analog signal generator. In another embodiment, a digital representation of the analog current and voltage waveforms are applied to the device under test over the digital network communication lines. Another test stimulus applied to the device under test includes control and status information representing a response of a virtual IED. Specifically, the processor 402 transmits data to a device under test 204 both for control and configuration purposes and to simulate data exchange from other IEDs which might exist in an actual power system.

Signal generation module 408 is provided including a digital signal processing device and an analog-to-digital converter. The signal generation module 408 communicates with the processor 402, on one hand, to assist in managing the processor 402 response to a given test condition to be applied to the device under test. Likewise, the signal and generation module 408 supplies the analog voltage and current waveforms through the amplifier 410 which are then output to the device under test 204 to simulate power system conditions. In another embodiment, a digital representation of simulated current and voltage waveforms is transmitted in place of the actual analog signals. In this embodiment, the analog signal lines are eliminated, leaving only digital communication over the network. Decoding of the digital representation may either be performed by a conversion device coupled to the device under test, as is known in the art, or directly by the IED. Other forms of test stimulus application can be utilized where such a stimulus effects a response from the device under test. Furthermore, test stimulus can be applied over the digital communication lines in the form of a standard twisted pair connection or through Ethernet physical optical connections.

Figure 7:
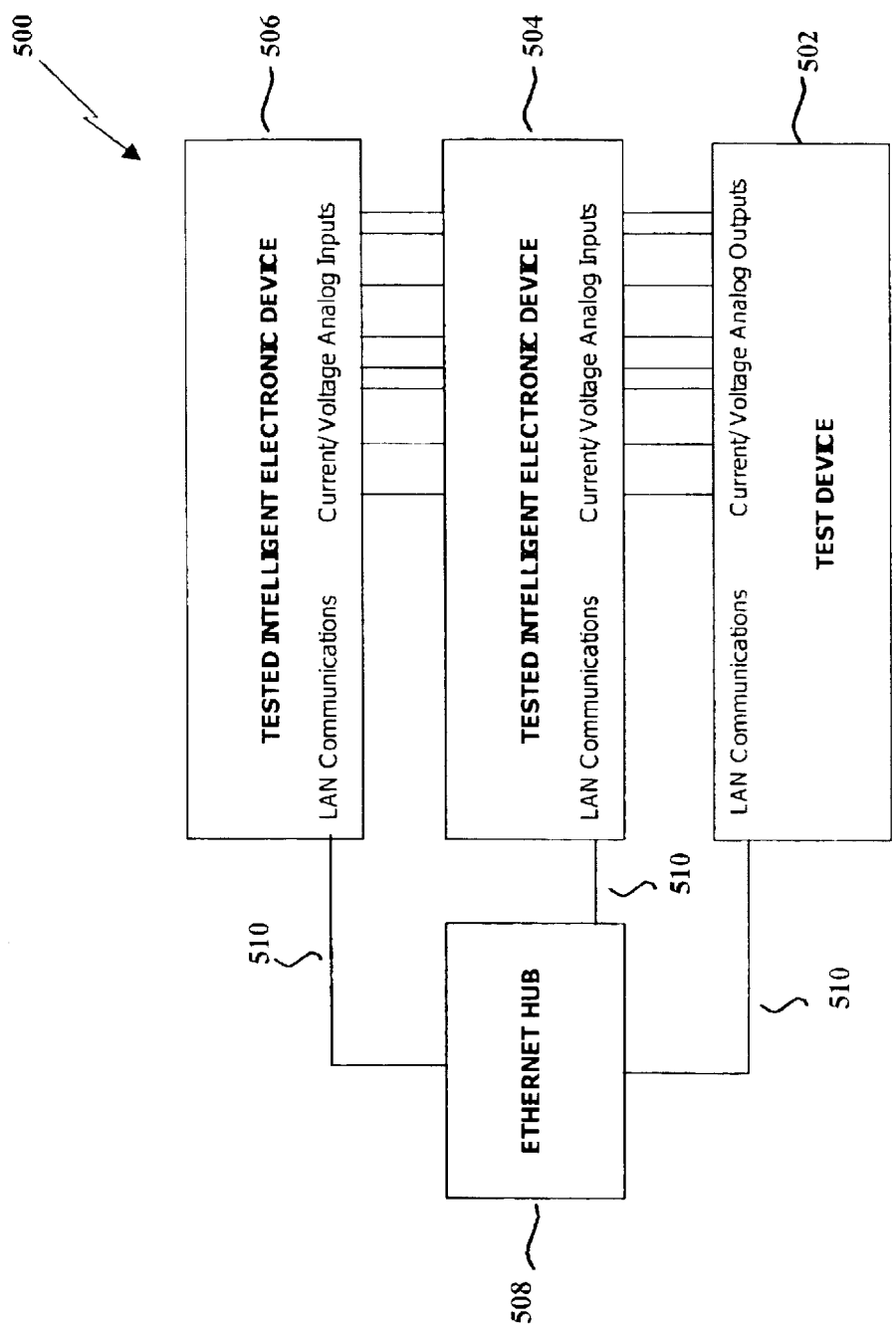
FIG. 7 is a diagram of the data communications based test system of an embodiment of the present invention for testing of multiple intelligent electronic devices over a local area network.

FIG. 7 shows a simplified diagram of an embodiment of the present invention with a local area network communications based system 500 for testing of a single or multiple intelligent electronic devices. As in the system 100 of FIG. 1, analog outputs can be configured to provide currents and voltages, to simulate the secondary currents and voltages seen by the IEDs under the simulated power system conditions. However, instead of relay outputs being used to simulate the status of primary or secondary substation equipment during the simulated power system fault or other conditions, data packets containing status information are constructed and sent by the test device 502 to the tested devices 504 and/or 506 over the local area network 510. An ethernet hub 508 can be external, or built into the test device.

Data packets received from the devices under test 504 and/or 506 over the local area network 510 are used to monitor the operation of the device under test in order to change states of the simulation as a function of the device operation. They are also used to evaluate the performance of the device(s) under test 504 or 506 for the simulated power system conditions. The system 500 meets all requirements for steady state or dynamic testing of intelligent electronic devices with high speed peer-to-peer communications capabilities, connected to the test device 502 over a local area network 510 during the testing process. This allows the testing process without the need for hardwiring between the test device and test objects.

Figure 8:
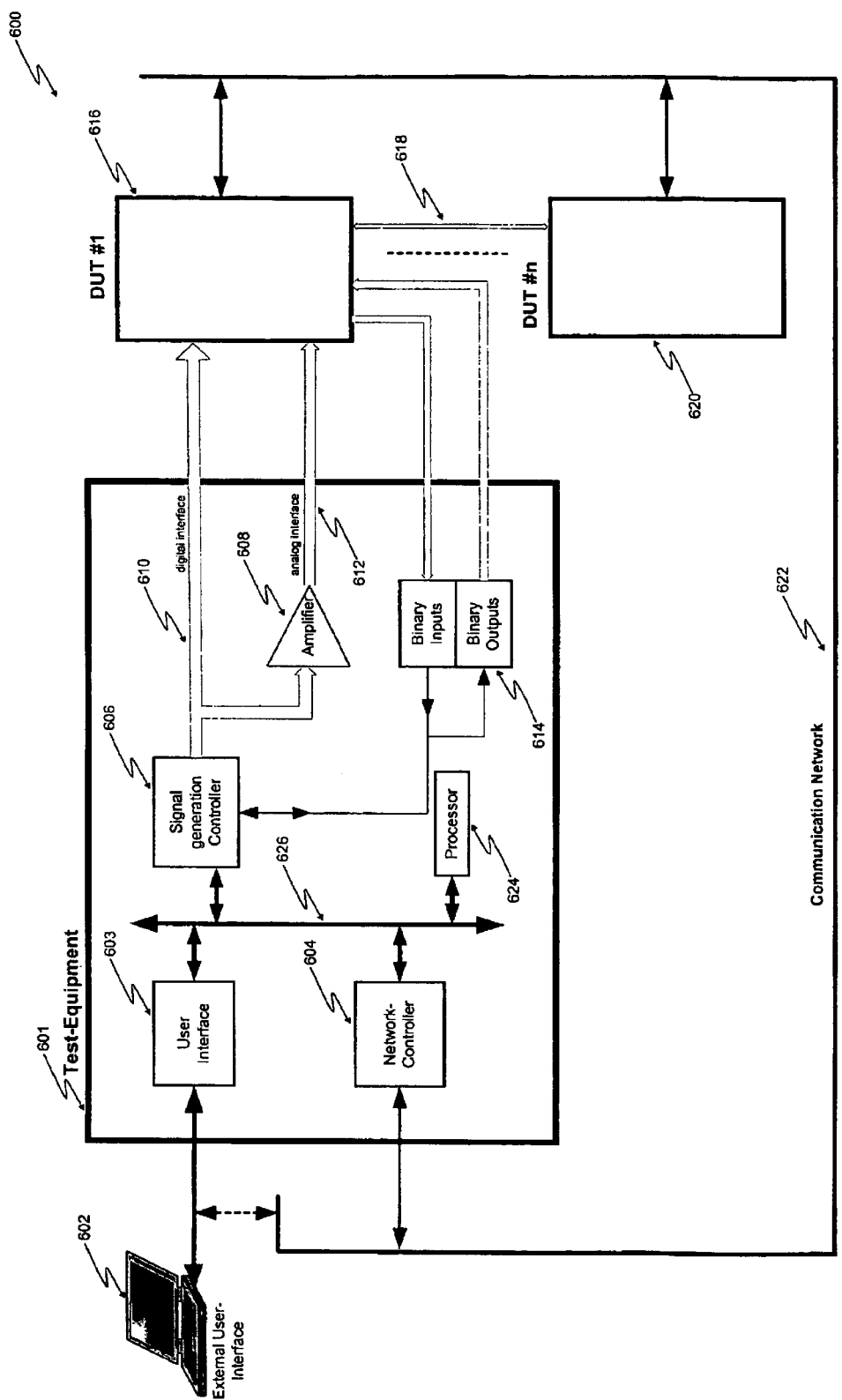
FIG. 8 is a simplified block diagram of a hardware configuration for the test system in FIG. 7.

Turning to FIG. 8, shown is a exemplary hardware configuration 600 for the system of FIG. 7. Specifically, test network 600 is associated with a test environment whereby test equipment 601 communicates over communication network 622 to perform test operations on a number of system devices connected to the network 622. Specifically, test network 600 is capable of testing any number of device(s) under test, such as device under test 616 and 620. Through the communication network 622, a large number of devices may be tested in concert with one another. This allows a test sequence to extend simulated test conditions to require interaction between multiple system devices. For example, a system condition may be simulated and applied to device under test 616 which may then cause a subsequent condition to be applied to device under test 620. Status information defining the response of each device under test is then collected over communication network 622 then analyzed within test equipment 601 or is sent to a user interface, such as notebook computer 602.

Test equipment 601 is similar to the configuration described with reference to FIG. 6 but further includes network controller 604 to manage communications over the communication network 622, such as a local area network or a wide area network. The processor 624 communicates over internal communications bus 626 with internal test equipment device components such as the network controller 604 to manage network communications, the user interface 603 to direct messages to and from an external user interface 602, and the signal generation controller 606 to manage both transmitted and received control messages as well as digital and analog test stimulus. For example, the signal generation controller 605 initiates a test sequence under direction of the processor 204 through communications over the internal bus 626. The test equipment 602, in turn, transmits and receives control messages to and from the devices under test over the communication network link 622. Exemplary control and status messages are discussed above with reference to FIG. 3 and FIG. 4.

An exemplary test sequence, once initiated, provides instruction to the signal generation controller 606 to produce and apply both digital and analog test stimulus to the device under test 616. Digital status information stimulus, for example, is applied over communications link 610 through communication network 622 representing, for example, device status information or device response from other intelligent electronic devices. Communications link 610 may be of any number of digital transmission types, including standard twisted pair connections and optical connections. Likewise, analog test stimulus including specific voltage and current waveforms are generated representing various electrical conditions that are then applied to the device under test 616 through amplifier 608. These analog voltage and current waveforms are applied to device under test 616 over the analog interface 612 to dedicated power input contacts on the device under test 616. According to one embodiment, the analog signal lines are altogether replaced with the digital communication network connections where the analog waveforms are simulated through digital representations of the voltage and current signals.

FIG. 8 is also helpful to illustrate synchronization of an applied test stimulus with a subsequent response from the devices under test. The user initiates a test sequence through user interface 602 that passes the test sequence to the signal generation controller 606. Upon the start signal, the signal generation controller 606 simultaneously initiates the analog outputs through amplifier 608 and marks the start with an internal processor clock. If appropriate, it also signals the network controller 604 to queue the digital status output message and note the time tag from the internal processor clock. This will substitute for the binary output control 614 toggle of the equipment status bit simulation to the devices under test 616 and 620.

Once the devices under test 616 and 620 process the initial analog stimulus condition, or digital simulation, it may or may not respond with a digital status message. If it responds, the message is received by the network controller 604 and time tagged with the internal processor clock, then passed to the signal generation controller 606 for analysis. Based on this status, the signal generation controller 606 will initiate the next analog or digital output state and time tag the transition. If this causes the devices under test 616 and 620 to change status based on processing these new values, then the devices under test 616 and 620 will send another status message and the received message will be time tagged by the network controller 604 and passed to the processor 624 for analysis. If this is the expected trip status response, the processor 624 will communicate with the signal generation controller 606 to stop the analog or digital output state and cause the network controller 604 to send a timed status message that simulates the equipment status to the devices under test 616 and 620. This either ends the test sequence or the test sequence continues until it is complete or the desired response from the network controller 604 is achieved. Once complete, the signal generation controller 606 along with the processor 624 analyzes the timed status response based on the test sequence and reports the results to the user interface 603 and then to the external user interface 602 if appropriate.

Since peer-to-peer communications are typically based on broadcast or multicast messages which use subscription to selected data packets based on the test process, a programmable capability for this subscription and mapping to internal test device process and logic may be present in the test device. According to one embodiment, since the test system should be able to simulate signals included in data packets generated from multiple IEDs on the local area network, a programmable capability for the configuration of such emulation may be present in the test device.

Hence, a test system is provided for testing of intelligent electronic devices with digital communications capabilities. The test device can be used in a serial communications based arrangement with a single tested device. The test device can also be used in a local area network arrangement for simulation and testing of multiple peer-to-peer communications based tested devices. Digital network and serial communications connections and protocols eliminate the need for individual hard-wiring of input/output connections between the test device and the device under test. The test device applies either analog waveforms or digital virtual test stimulus, or a combination of both, to effect a physical response from a device under test. Based on the response transmitted back to the test device, the test device provides performance analysis of the device under test or uses the response information in completion of a series of test conditions for a programmed test sequence.

The foregoing disclosure and description of the various embodiments are illustrative and explanatory thereof, and various changes in the type of communication network, the components of the test device, the user interface, the analog and digital generation and other circuitry, the organization of the components, and the order and timing of steps taken as well as in the details of the illustrated system may be made without departing from the spirit of the invention.

I claim:

1. A method for testing electric power devices employing data exchange over a digital communications link, the method comprising the steps of:

applying a test stimulus from a testing device to a power device under test;

receiving in the testing device over digital signal lines test status information from the power device under test, the test status information generated by the device under test in response to application of the test stimulus, the test status information further communicated over the digital communications link;

synchronizing the received status information with the application of the test stimulus to form synchronized status information;

determining a device under test response from the synchronized status information; and adjusting the test stimulus in response to the device under test response.

2. The method of claim 1, wherein all the method steps are recursively repeated to perform a multiple power system condition test sequence.

3. A method for testing electric power devices employing data exchange over a digital communications link, the method comprising the step of:

applying a test stimulus from a testing device to a power device under test;

receiving in the testing device over digital signal lines test status information from the power device under test, the test status information generated by the device under test in response to application of the test stimulus, the test status information further communicated over the digital communications link; and synchronizing the received status information with the application of the test stimulus to form synchronized status information;

wherein the test stimulus comprises simulated power system status information in data packet form transmitting to the device under test over the digital communications link.

4. A method for testing electric power devices employing date exchange over a digital communications link, the method comprising the steps of:

applying a test stimulus from a testing device to a power device under teat;

receiving in the testing device over digital signal lines test status information from the power device under test, the test status information generated by the device under test in response to application of the test stimulus, the test status information further communicated over the digital communications link; and synchronizing the received status information with the application of the test stimulus to form synchronized status information;

wherein the testing device operates as a virtual intelligent electronic device providing virtual control or status information to the device under test.

5. A method for testing electric power devices employing date exchange over a digital communications link, the method comprising the steps of:

applying a test stimulus from a testing device to a power device under teat;

receiving in the testing device over digital signal lines test status information from the power device under test, the test status information generated by the device under test in response to application of the test stimulus, the test status information further communicated over the digital communications link; and synchronizing the received status information with the application of the test stimulus to form synchronized status information;

wherein the testing device received status information from the device under test in response to interaction between the device under test and other intelligent electronic devices.

6. A test system for testing electric power devices employing date exchange over a digital communications link, comprising:

at least one power device under test, comprising:
  a plurality of analog inputs for receiving simulated test signals;
  at least one digital input/output port for receiving and transmitting digital data packets;
  a status register for storing status information of the power device under test;
  a testing device coupled to power device under test through analog and digital communications lines, comprising:
    a processor;
    an analog signal generator for outputting simulated test signals over the analog communications lines; and
    a memory coupled to the processor having computer readable code embodied therein for transacting digital communications with the power device under test, the code for directing the processor to perform the steps of:
      receiving status information in the form of digital data packets from the power device under test in response to application of simulated test signals; and
      synchronizing the received status information with the simulated test signals to form synchronized status information; the code in memory further directing the processor to perform the step of:
        determining a device under test response from the synchronized status information and
        the code in memory further directing the processor to perform the step of:
          adjusting the test signals in response to the device under test response.

7. The test system of claim 6, wherein all the teat system steps directed by the code in memory are recursively repeated to perform a multiple power system condition test sequence.

8. A test system for testing electric power devices employing data exchange over a digital communications link, comprising:

at least one power device under test comprising:
  a plurality of analog inputs for receiving simulated test signals;
  at least one digital input/output port for receiving and transmitting digital data packets;
  a status register for storing status information of the power device under test;
  a testing device coupled to power device under test through analog and digital communications lines, comprising:
    a processor;
    an analog signal generation for outputting simulated test signals over the analog communications lines; and
    a memory coupled to the processor having computer readable code embodied therein for transacting digital communication with the power device under test the code for directing the processor to perform the steps of:
      receiving status information in the form of digital data packets from the power device under test in response to application of simulated test signals; and
      synchronizing the received status information with the simulated test signals to from synchronized status information;
    the code in memory further directing the processor to perform the step of:
      determining a device under test response from the synchronized status information,
      wherein the test signals comprise simulated power system status information in digital data form transmitted to the device under test over the digital communications link.

9. A test system for testing electric power devices employing data exchange over a digital communication link, comprising:

at least one power device under test, comprising:
  a plurality of analog inputs for receiving simulated test signals;
  at least on digital input/output port for receiving and transmitting digital data packets;
  a status register for storing status information of the power device under test;
  a testing device coupled to power device under test through analog and digital communications lines, comprising:
    a processor;
    an analog signal generator for outputting simulated test signals over the analog communications lines; and
    a memory coupled to the processor having computer readable code embodied therein for transacting digital communications with the power device under test the code for directing the processor to perform the steps of:
      receiving status information in the form of digital data packets from the power device under test in response to application of simulated test signals; and
    synchronizing the received status information with the simulated test signals to form synchronized status information:
      wherein the testing device operates as a virtual intelligent electronic device providing virtual control or status information to the device under test.

10. A test system for testing electric power devices employing data exchange over a digital communications link, comprising:

at least one power device under test comprising:
  a plurality of analog inputs for receiving simulated test signals;
  at least one digital input/output port for receiving and transmitting digital data packets;
  a status register for storing status information of the power device under test;
  a testing device coupled to power device under test through analog and digital communications lines, comprising:
    a processor;
    an analog signal generator for outputting simulated test signals over the analog communications lines; and
    a memory coupled to the processor having computer readable code embodied therein for transacting digital communications with the power device under test, the code for directing the processor to perform the steps of:
      receiving status information in the form of digital data packets from the power device under test in response to application of simulated test signals; and
      synchronizing the received status information with the simulated test signals to form synchronized status information:
        wherein the testing device received status information from the device under test in response to interaction between the device under test and other intelligent electronic devices.

11. A power protection and control test device for communication the status of simulated substation or protection and control equipment over a digital communication link from the test device to one or more intelligent electronic devices in a power system, comprising:
  a testing device coupled to a device under test in the power system through a digital communications lines, comprising:
    a processor;
    a memory coupled to the processor having computer readable code embodied therein for transacting digital communications with the device under test, the code for directing the processor to perform the steps of:
      transmitting a test stimulus to the device under test;
      receiving status information in the form of digital data packets from the power device under test in response to application of the test stimulus; and
      synchronizing the received status information with the test stimulus to form synchronized status information,
    the code in memory further directing the processor to perform the step of:
      determining device under test response from the synchronized status information:
        the code in memory further directing the processor to perform the step of:
          adjusting the test stimulus in response to the device under test response.

12. The test device of claim 11, wherein all the test device steps directed by the code in memory are recursively repeated to perform a multiple power system condition test sequence.

13. A power protection and control rest device for communicating the status of simulated substation or protection and control equipment over a digital communications link from the test device to one or more intelligent electronic devices in a power system, comprising:
  a testing device coupled to a device under test in the power system through a digital communications lines, comprising:
    a processor,
    a memory coupled to the processor having computer readable code embodied therein for transacting digital communication with the device under test, the code for directing the processor to perform the steps of:
      transmitting a test stimulus to the device under test;
      receiving status information in the form digital packets from the power device under in response to application of the test stimulus; and
      synchronizing the received status information with the test stimulus to form synchronized status information,
    wherein the teat stimulus comprise simulated power system status information in digital data form transmitted to the device under test over the digital communications link.

14. A power protection and control test device for communication the status of simulated substation or protection and control equipment over a digital communication link from the test device to one more intelligent electronic devices in a power system comprising:
  a testing device coupled to a device under test in the power system through a digital communications lines, comprising:
    a processor;
    a memory coupled to the processor having computer readable code embodied therein for transacting digital communications with the device under test, the code for directing the processor to perform the steps of:
      transmitting a test stimulus to the device under test; from the power device under test in response to application of the test stimulus; and
      synchronizing the received status information with the test stimulus to form synchronized status information,
    wherein the testing device operates as a virtual intelligent electronic device providing virtual control or status information to the device under test.

15. A power protection and control test device for communicating the status of simulated substation or protection and control equipment over a digital communications link from the test device to one or more intelligent electronio devices in a power system, comprising:
  a testing device coupled to a device under test in the power system through a digital communications lines, comprising:
    a processor;
    a memory coupled to the processor having computer readable code embodied therein for transacting digital communications with the device under test, the code for directing the processor to perform the steps of:
      transmitting a test stimulus to the device under test;
      receiving status information in the form of digital data packets from the power device under test in response to application of the test stimulus; and
      synchronizing the received status information with the test stimulus to form synchronized status information,
    wherein the testing device received status information from the device under test in response to interaction between the device under test and other intelligent electronic devices.

* * * * *